United States Patent
Nagai

(10) Patent No.: US 10,903,215 B2
(45) Date of Patent: Jan. 26, 2021

(54) LAYOUT STRUCTURE OF SEMICONDUCTOR STRUCTURE FOR DYNAMIC RANDOM ACCESS MEMORY DEVICE AND METHOD FOR FORMING THE SAME

(71) Applicants: UNITED MICROELECTRONICS CORP., Hsin-Chu (TW); Fujian Jinhua Integrated Circuit Co., Ltd., Quanzhou (CN)

(72) Inventor: Yukihiro Nagai, Saijo (JP)

(73) Assignees: UNITED MICROELECTRONICS CORP., Hsin-Chu (TW); Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 16/102,748

(22) Filed: Aug. 14, 2018

(65) Prior Publication Data
US 2018/0358364 A1 Dec. 13, 2018

Related U.S. Application Data

(63) Continuation of application No. 15/465,580, filed on Mar. 21, 2017, now Pat. No. 10,083,968.

(30) Foreign Application Priority Data
Mar. 1, 2017 (CN) .......................... 2017 1 0116628

(51) Int. Cl.
*H01L 27/108* (2006.01)

(52) U.S. Cl.
CPC .. *H01L 27/10894* (2013.01); *H01L 27/10814* (2013.01); *H01L 27/10823* (2013.01); *H01L 27/10855* (2013.01); *H01L 27/10876* (2013.01); *H01L 27/10885* (2013.01); *H01L 27/10897* (2013.01)

(58) Field of Classification Search
CPC ......... H01L 21/02603; H01L 27/10823; H01L 27/10894; H01L 27/10814; H01L 27/10855; H01L 27/10876; H01L 27/10897; H01L 27/10885
See application file for complete search history.

(56) References Cited

U.S. PATENT DOCUMENTS

| 5,026,658 A * | 6/1991 | Fuse ................. H01L 27/10832 257/E27.093 |
| 6,165,898 A | 12/2000 | Jang |
| 6,300,235 B1 | 10/2001 | Feldner |
| 6,303,432 B1 * | 10/2001 | Horita ............... H01L 21/76224 257/E21.546 |

(Continued)

FOREIGN PATENT DOCUMENTS

CN 102097435 A 6/2011

*Primary Examiner* — Allen L Parker
*Assistant Examiner* — Charles N Ausar-El
(74) *Attorney, Agent, or Firm* — Winston Hsu

(57) ABSTRACT

A semiconductor structure for a memory device includes a substrate including a memory cell region and a peripheral circuit region defined thereon, at least an active region formed in the peripheral circuit region, a buried gate structure formed in the active region in the peripheral circuit region, a conductive line structure formed on the buried gate structure, and at least a bit line contact plug formed in the memory cell region.

10 Claims, 17 Drawing Sheets

(56) References Cited

U.S. PATENT DOCUMENTS

| | | | |
|---|---|---|---|
| 6,323,118 B1 | 11/2001 | Shih | |
| 6,498,062 B2 * | 12/2002 | Durcan | H01L 27/10823 257/302 |
| 6,680,254 B2 | 1/2004 | Sun | |
| 6,700,205 B2 * | 3/2004 | Tang | H01L 21/76895 257/300 |
| 6,734,482 B1 * | 5/2004 | Tran | H01L 27/10814 257/296 |
| 6,770,535 B2 * | 8/2004 | Yamada | H01L 21/763 257/329 |
| 7,001,823 B1 * | 2/2006 | Gopinath | H01L 21/76224 257/E21.546 |
| 7,141,485 B2 * | 11/2006 | Su | H01L 21/76232 438/424 |
| 7,151,314 B2 | 12/2006 | Maneki | |
| 7,190,050 B2 * | 3/2007 | King | H01L 21/84 257/401 |
| 7,518,184 B2 * | 4/2009 | Tran | H01L 27/10876 257/327 |
| 7,825,488 B2 * | 11/2010 | Williams | H01L 21/26513 257/500 |
| 8,049,298 B2 * | 11/2011 | Violette | H01L 27/11517 257/314 |
| 8,179,155 B2 * | 5/2012 | Tseng | G01R 31/2818 324/762.01 |
| 8,399,319 B2 | 3/2013 | Lee | |
| 8,410,617 B2 * | 4/2013 | Leedy | H01L 27/0688 257/777 |
| 8,492,812 B2 | 7/2013 | Hwang | |
| 8,492,833 B2 | 7/2013 | Ku | |
| 8,609,457 B2 * | 12/2013 | Baars | H01L 27/10894 257/296 |
| 8,653,603 B2 * | 2/2014 | Park | H01L 27/105 257/369 |
| 8,748,978 B2 * | 6/2014 | Lee | H01L 21/82382 257/331 |
| 8,829,583 B2 * | 9/2014 | Taketani | H01L 27/10814 257/296 |
| 8,927,989 B2 * | 1/2015 | Arnold | H01L 22/32 257/48 |
| 9,063,193 B2 * | 6/2015 | Chang | H01L 22/34 |
| 9,240,415 B2 * | 1/2016 | Park | H01L 27/10894 |
| 9,305,927 B2 * | 4/2016 | Cho | H01L 27/10876 |
| 9,373,625 B2 * | 6/2016 | Kim | H01L 27/10823 |
| 9,646,877 B2 | 5/2017 | Lee | |
| 10,083,968 B1 * | 9/2018 | Nagai | H01L 27/10894 |
| 2002/0135007 A1 * | 9/2002 | Koike | H01L 27/10829 257/301 |
| 2004/0026759 A1 * | 2/2004 | Nakabayashi | H01L 27/0207 257/499 |
| 2007/0029619 A1 * | 2/2007 | Kim | H01L 21/28114 257/368 |
| 2008/0284029 A1 * | 11/2008 | Kim | H01L 21/76829 257/758 |
| 2009/0236684 A1 * | 9/2009 | Lee | H01L 21/76229 257/510 |
| 2011/0156262 A1 * | 6/2011 | Shin | H01L 27/10855 257/773 |
| 2011/0198700 A1 * | 8/2011 | Park | H01L 27/105 257/369 |
| 2012/0086063 A1 | 4/2012 | Taniguchi | |
| 2012/0091518 A1 * | 4/2012 | Sukekawa | H01L 27/10855 257/296 |
| 2012/0132968 A1 * | 5/2012 | Choi | H01L 27/108 257/296 |
| 2012/0153363 A1 * | 6/2012 | Shin | H01L 27/10876 257/288 |
| 2012/0161227 A1 * | 6/2012 | Oyu | H01L 27/10876 257/330 |
| 2012/0281490 A1 * | 11/2012 | Cho | H01L 27/10876 365/205 |
| 2013/0052786 A1 * | 2/2013 | Lee | H01L 27/10855 438/381 |
| 2014/0159193 A1 * | 6/2014 | Kim | H01L 29/0649 257/513 |
| 2015/0031195 A1 * | 1/2015 | Kim | H01L 21/28088 438/589 |
| 2015/0249206 A1 * | 9/2015 | Kim | H01L 43/02 257/421 |
| 2015/0263024 A1 * | 9/2015 | Hishida | H01L 21/82343 257/329 |
| 2015/0303250 A1 * | 10/2015 | Ishikawa | H01L 21/76229 257/510 |
| 2016/0027701 A1 * | 1/2016 | Saino | H01L 29/0649 438/294 |
| 2016/0049407 A1 * | 2/2016 | Son | H01L 27/10814 438/270 |
| 2016/0181143 A1 * | 6/2016 | Kwon | H01L 27/1052 438/586 |
| 2018/0122809 A1 * | 5/2018 | Lin | H01L 27/10891 |

* cited by examiner

US 10,903,215 B2

LAYOUT STRUCTURE OF SEMICONDUCTOR STRUCTURE FOR DYNAMIC RANDOM ACCESS MEMORY DEVICE AND METHOD FOR FORMING THE SAME

CROSS REFERENCE TO RELATED APPLICATIONS

This application is a continuation application of application Ser. No. 15/465,580, filed on Mar. 21, 2017 and entitled "SEMICONDUCTOR STRUCTURE, SEMICONDUCTOR STRUCTURE FOR MEMORY DEVICE AND METHOD FOR FORMING THE SAME", which is incorporated herein by reference.

BACKGROUND OF THE INVENTION

1. Field of the Invention

The present invention relates to a semiconductor structure, a semiconductor structure for a memory device, and a method for forming the same, and more particularly, to a semiconductor structure, a semiconductor structure for a dynamic random access memory (hereinafter abbreviated as DRAM) device and a method for forming the same.

2. Description of the Prior Art

Generally, a semiconductor memory device is classified as a random access memory (RAM) and a read only memory (ROM), and the RAM includes a dynamic RAM (DRAM) and static RAM (SRAM). One memory cell of DRAM includes one transistor and one capacitor while one memory cell of SRAM includes four transistors and two loaded resistors. The DRAM is used widespread than the SRAM because the DRAM is more efficient than the SRAM in a chip integration and a manufacturing process.

Please refer to FIG. 1, which is a schematic circuit diagram demonstrating a DRAM device. As shown in FIG. 1, the DRAM device 100 includes a plurality of memory cells 110 arranged in array-like manner, i.e. in row and column directions in a memory cell region, and the memory cells 110 are controlled by bit lines (BLs) 120 and word lines (WLs) 130 to store data. In a periphery region of the DRAM device, BL sensing amplifiers 140 are located. The BL sensing amplifier 140 amplifies a small potential difference between the bit lines in order to read data from the memory cells 110 or refresh data stored in the memory cells 110.

Please refer to FIG. 2, which is a schematic circuit diagram demonstrating a BL sensing amplifier 140. As shown in FIG. 2, the BL sensing amplifier 140 includes an amplifying unit 142 and a pre-charge unit 144. The amplifying unit 142 includes two p-typed MOS transistors electrically connected to a bit line pair (including a bit line BL and a bit line bar /BL) and a pull-up power line RTO. The amplifying unit 142 also includes two n-typed MOS transistors electrically connected to the bit line pair BL and /BL and a pull-down power line SB. The amplifying unit 142 is to amplify a potential difference between the bit line pair. The pre-charge unit 144 includes three n-typed MOS transistors. Two of the n-typed MOS transistors that are electrically connected in series are further electrically connected to the bit line pair BL and /BL and serve as BL pre-charge transistors. And the other n-typed transistor that is electrically connected to the two pre-charge transistors in parallel is further electrically connected to the bit line pair BL and /BL, and serves as a BL equalizer transistor. The pre-charge unit 144 pre-charges and equalizes the bit line pair BL and /BL to the level of the pre-charge voltage VBLP in response to a pre-charge control signal BLEQ.

It is concluded that the DRAM device includes not only the memory cells that are arranged in array-like manner in the memory region but also other logic devices that are formed in non-memory/peripheral region. As memory cells of the DRAM device become more integrated and miniaturized, fabrication of those elements becomes more difficult. For example, size reduction to elements in the BL sensing amplifier 140 in the peripheral region is as important as miniaturization of the memory cell 110 in the memory cell region. Therefore, a design for a semiconductor structure for the DRAM device and a method for forming the same is still in need.

SUMMARY OF THE INVENTION

According to an aspect of the present invention, a semiconductor structure for a memory device is provided. The semiconductor structure for the memory device includes a substrate including a memory cell region and a peripheral circuit region defined thereon, at least an active region formed in the peripheral circuit region, a buried gate structure formed in the active region, a conductive line structure formed on the buried gate structure, and at least a bit line contact plug formed in the memory cell region.

According to an aspect of the present invention, a semiconductor structure is provided. The semiconductor structure includes a substrate including a memory cell region and a peripheral circuit region defined thereon, at least a buried gate structure formed in the peripheral circuit region, a bit line structure formed on the substrate in the memory cell region, a planar gate structure formed on the substrate in the peripheral circuit region, and an insulating layer sandwiched between the buried gate structure and the planar gate structure. The planar gate structure is directly formed on the buried gate structure. More important, the planar gate structure and the buried gate structure are physically spaced apart and electrically isolated from each other by the insulating layer.

According to an aspect of the present invention, a method for forming a semiconductor structure for a memory device is provided. The method includes the following step. A substrate including a memory cell region and a peripheral circuit region defined thereon is provided. And at least an active region is formed in the peripheral circuit region. Next, at least a buried gate structure is formed in the active region, and an insulating layer is formed on a top of the buried gate structure. Subsequently, a conductive line structure is formed on the buried gate structure, and the conductive line structure and the buried gate structure are physically spaced apart and electrically isolated from each other by the insulating layer.

According to the semiconductor structure, the semiconductor structure for the memory device, and the method for forming the same provided by the present invention, the buried gate structure is formed in the peripheral circuit region. More important, the buried gate structure concurrently serves as the gates for the three transistors of the pre-charge unit of the BL sensing amplifier. And the conductive line structure or the planar gate structure that provides the pre-charge voltage VBLP is directly formed on the buried gate structure. Consequently, area required by the pre-charge unit is reduced. Furthermore, landing pads which occupy large areas but are always required in the prior art can be taken out according to the present invention, and thus product yield is improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 3-7 are schematic drawings illustrating a method for forming a semiconductor structure for a DRAM device provided by a first preferred embodiment of the present invention, wherein FIG. 4 is a schematic drawing in a step subsequent to FIG. 3; FIG. 5 is a schematic drawing in a step subsequent to FIG. 4; FIG. 6 is a schematic drawing in a step subsequent to FIG. 5; and FIG. 7 is a schematic drawing in a step subsequent to FIG. 6.

FIGS. 3 and 8-9 are schematic drawings illustrating a method for forming a semiconductor structure for a DRAM device provided by a second preferred embodiment of the present invention, wherein FIG. 8 is a schematic drawing in a step subsequent to FIG. 3; and FIG. 9 is a schematic drawing in a step subsequent to FIG. 8.

FIGS. 3 and 10-11 are schematic drawings illustrating a method for forming a semiconductor structure for a DRAM device provided by a third preferred embodiment of the present invention, wherein FIG. 10 is a schematic drawing in a step subsequent to FIG. 3; and FIG. 11 is a schematic drawing in a step subsequent to FIG. 10.

DETAILED DESCRIPTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have been described in detail in order to avoid obscuring the invention.

It will be understood that when an element is referred to as being "formed" on another element, it can be directly or indirectly, formed on the given element by growth, deposition, etch, attach, connect, or couple. And it will be understood that when an elements or a layer is referred to as being "on", "connected to", or "coupled to" another element or layer, it can be directly on, connected or coupled to the other element or layer or intervening elements or layers may be present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

Spatially relative terms, such as "beneath", "below", "lower", "above", "upper", "in", "on" and the like, may be used herein for ease of description to describe one element or feature's relationship to another element(s) or feature(s) as illustrated in the figures. It will be understood that spatially relative terms are intended to encompass different orientations of the device in use or operation in addition to the orientations depicted in the figures. For example, if the device in the figures in turned over, elements described as "below" or "beneath" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of the inventions. As used herein, the singular form "a", "an" and "the" are intended to include the plural forms as well, unless the context clearly indicates otherwise.

Figure 1:
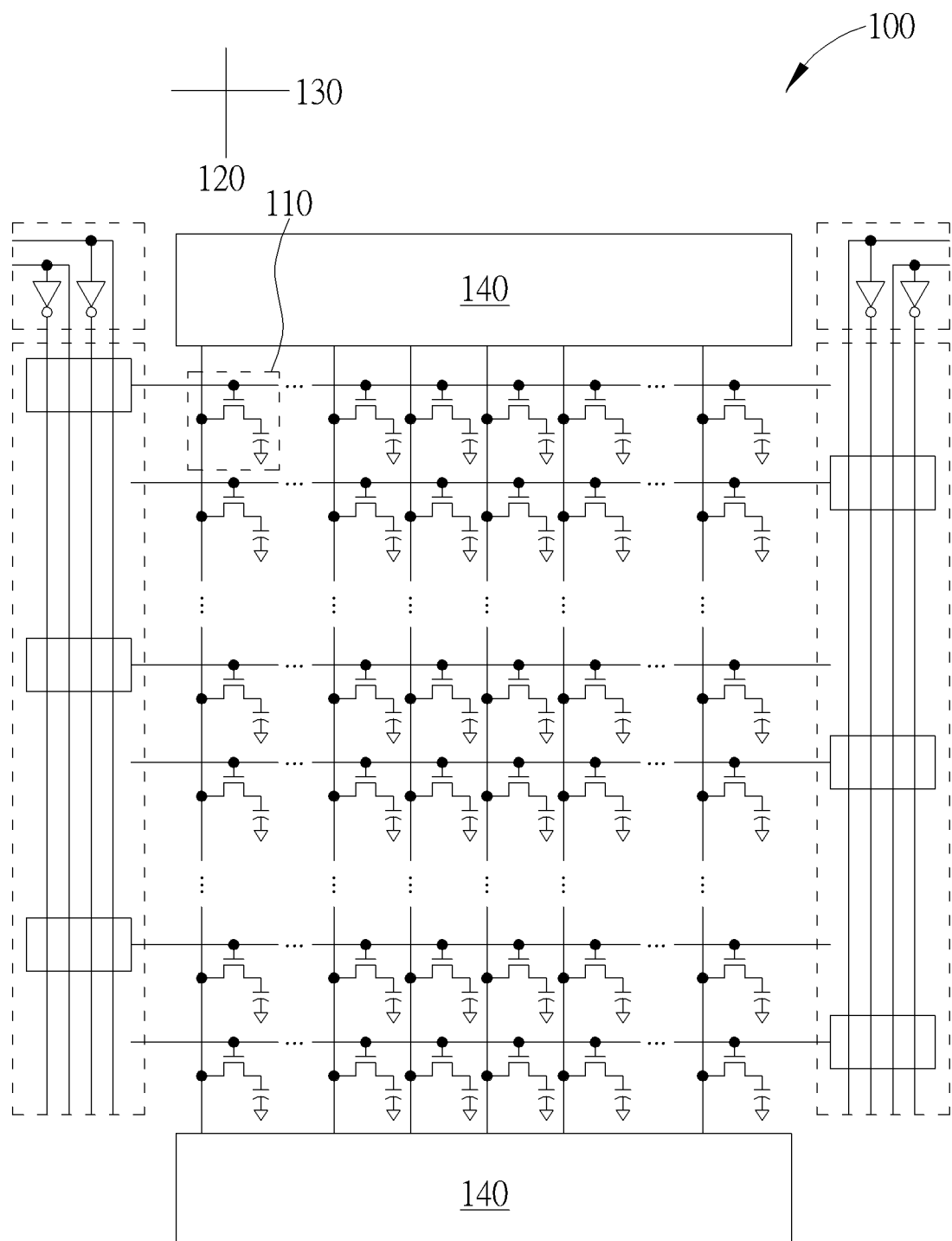
FIG. 1 is a schematic circuit diagram demonstrating a DRAM device.
Figure 2:
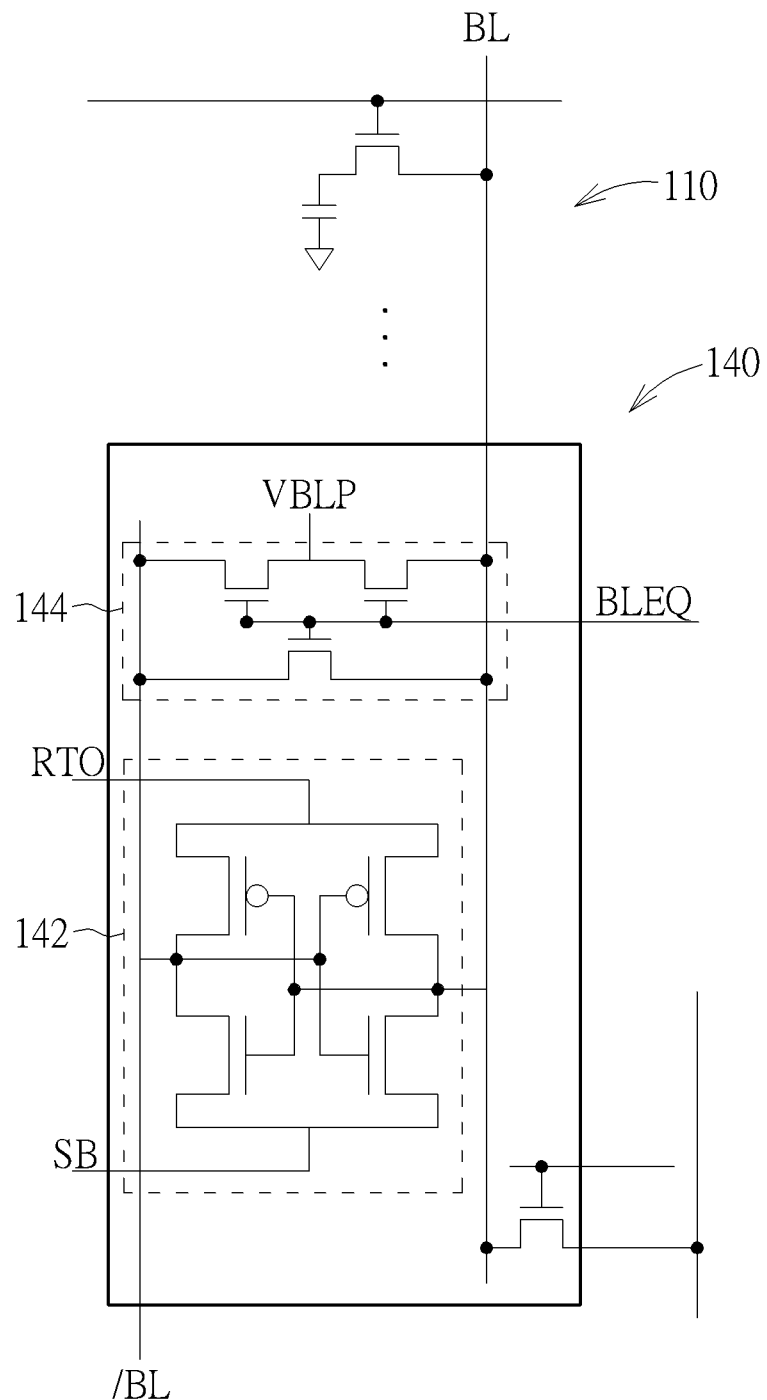
FIG. 2 is a schematic circuit diagram demonstrating a bit line sensing amplifier.
Figure 3:
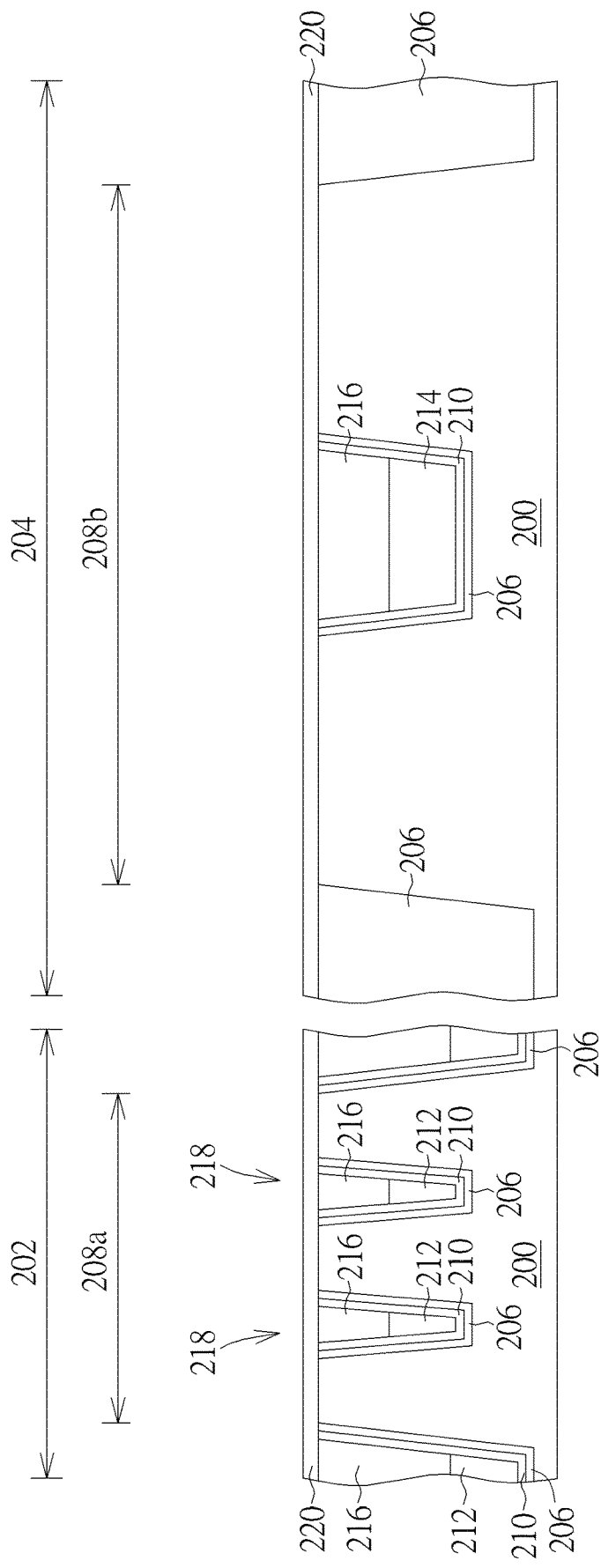

Please refer to FIGS. 3-7, which are schematic drawings illustrating a method for forming a semiconductor structure for a DRAM device provided by a first preferred embodiment of the present invention. As shown in FIG. 3, a substrate 200 is provided. The substrate 200 can include a silicon (Si) substrate, a germanium (Ge) substrate, or a SiGe substrate, but not limited to this. The substrate 200 includes at least a memory cell region 202 and a peripheral circuit region 204 defined thereon. A plurality of shallow trench isolation (hereinafter abbreviated as STI) structures 206 are formed in the substrate 200 in the memory cell region 202 and the peripheral circuit region 204. The STI structures 206 are formed to define a plurality of active regions 208a in the memory cell region 202 and at least an active region 208b in the peripheral circuit region 204. The STI structures 206 are also formed to provide electrical isolations between the active regions 208a/208b. Next, a plurality of recesses are formed in the substrate 200 and the STI structures 206, and a dielectric layer 210 is then formed to cover sidewalls and bottoms of the recesses. Thereafter, a buried gate 212 is formed in each recess in the memory cell region 202. It is noteworthy that a buried gate structure 214 is formed in the recess in the STI structure 206 in the peripheral circuit region 204 simultaneously with forming the buried gates 212 in the memory cell region 202 according to the preferred embodiment. And the buried gate structure 214 serves as a buried word line structure 214. As shown in FIG. 3, top surfaces of the buried gates 212 and the buried word line structure 214 are all lower than a surface of the substrate 200. The buried gates 212 and the buried word line structure 214 can include doped semiconductor material such as doped silicon, metal material such as tungsten (W), aluminum (Al), titanium (Ti), and/or tantalum (Ta), metal nitride such as titanium nitride (TiN), tantalum nitride (TaN), and/or tungsten nitride (WN), and metal-semiconductor compound such as metal silicide, but not limited to this. After forming the buried gates 212 and the buried word line structure 214, an insulating layer 216 is formed to seal the recesses. The insulating layer 216 can include silicon oxide (SiO), silicon nitride (SiN), and/or silicon oxynitride (SiON), but not limited to this. Thereafter, source/drain regions (not shown) are formed in the substrate 200 at two sides of the buried gates 212 and the buried word line structure 214. Accordingly, a plurality of memory cells 218 are formed in the memory cell region 202, and the memory cells 218 are arranged in array-like manner, i.e. in row and column directions in the memory cell region 202. However, those skilled in the art would easily realize that the memory cells 218 can be formed by any other suitable processes, and thus steps for forming the memory cells are not limited to this. After forming the source/drain regions, an insulating layer 220 is blanketly formed on the substrate 200. The insulating layer 220 can serve as a gate dielectric layer for subsequently formed transistors in the peripheral circuit region, and thus the insulating layer 220 can include SiO, SiN, SiON, and/or high-k material, but not limited to this.

Figure 4:
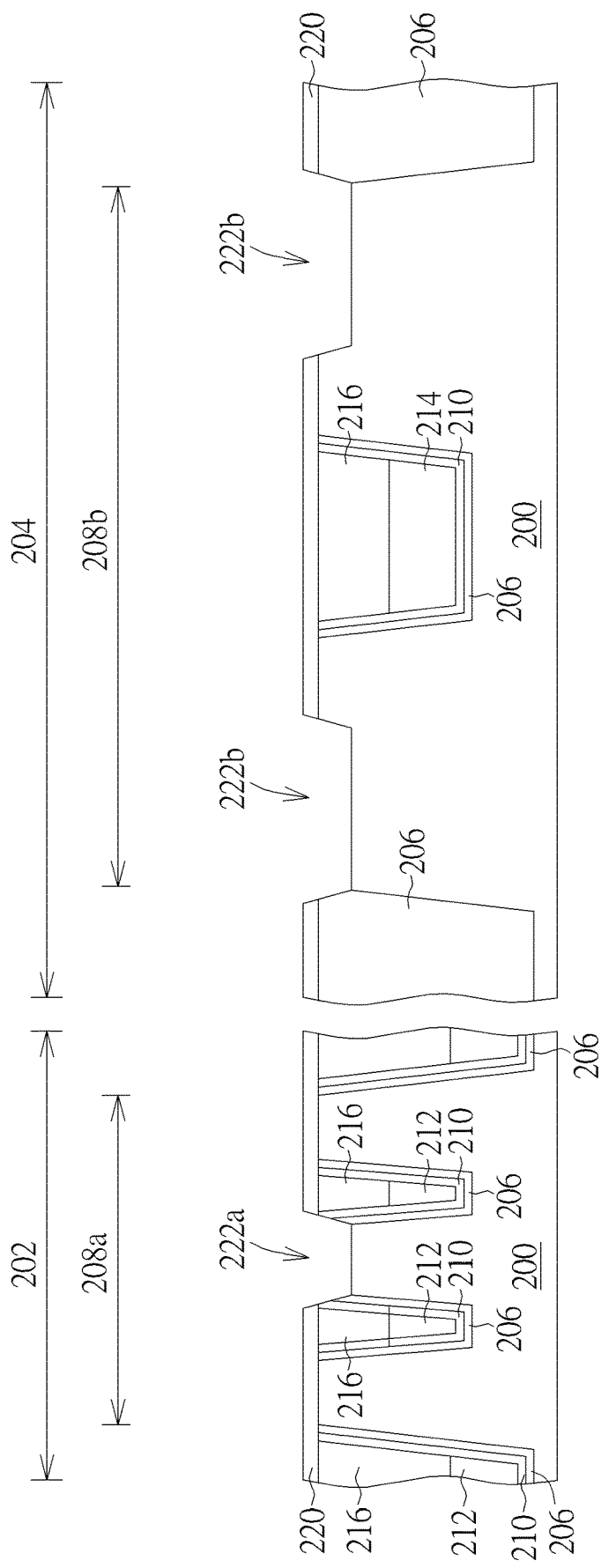
Figure 5:
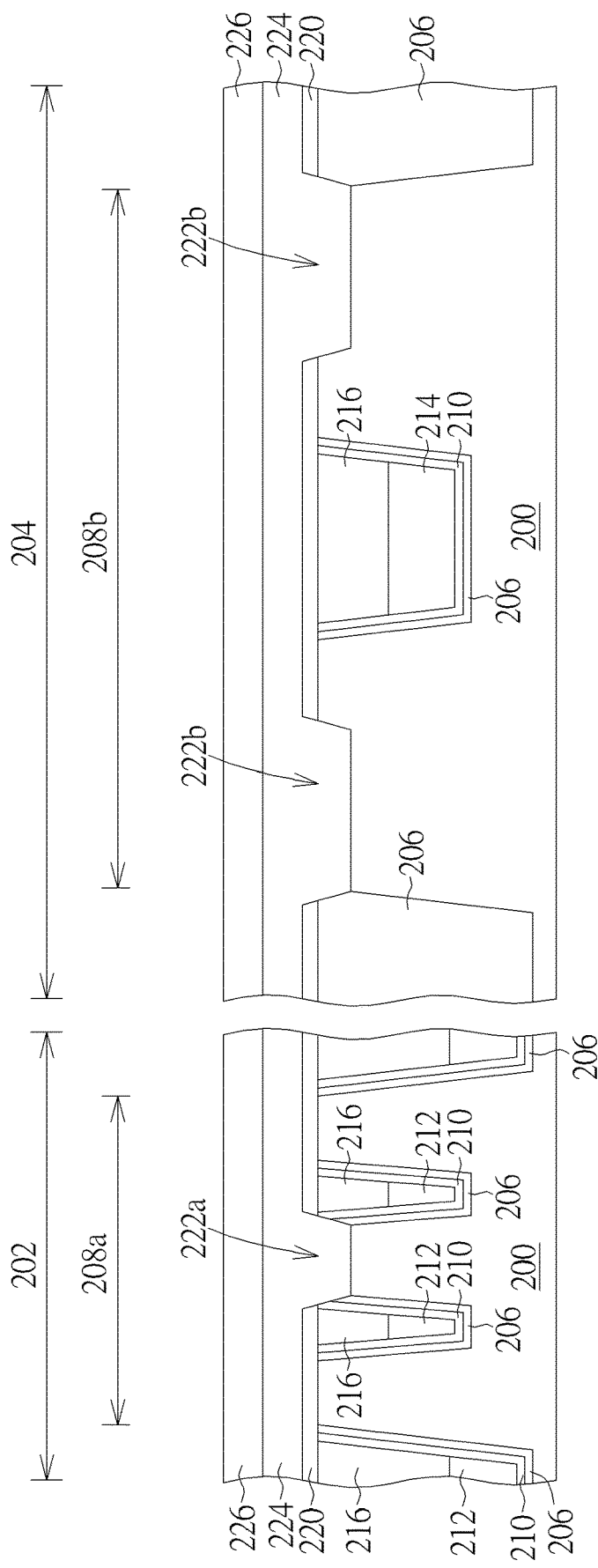

Please refer to FIG. 4. A patterned process is then performed to remove portions of the insulating layer 220, and thus a portion of the active regions 208a in the memory cell region 202 and portions of the active region 208b in the peripheral circuit region 204 are exposed as shown in FIG. 4. In the memory cell region 202, the portion of each active region 208a that is in between the two buried gates 212 is exposed. In other words, the source/drain region in between the two buried gates 212 in each active region 208a in the memory cell region 202 is exposed while the portions of the active region 208b at two sides of the buried word line structure 214 in the peripheral circuit region 204 are exposed. In some embodiments of the present invention, steps as shown in FIG. 5 can be performed directly after exposing the abovementioned portions of the active region 208a/208b. However, in other embodiments of the present invention, the exposed portions/substrate 200 can be etched and thus a recess 222a is formed in between the two buried gates 212 in each active region 208a in the memory cell region 202, and recesses 222b are formed in the active region 208b at the two sides of the buried word line structure 214 in the peripheral circuit region 204, as shown in FIG. 4.

Please refer to FIG. 5. Next, a semiconductor layer 224 is blanketly formed on the substrate 200 and a metal-containing layer 226 is subsequently formed on the semiconductor layer 224. According to the preferred embodiment, the semiconductor layer 224 can include a doped polysilicon layer, and the metal-containing layer 226 can be a metal layer and/or a metal silicide layer, but not limited to this.

Figure 6:
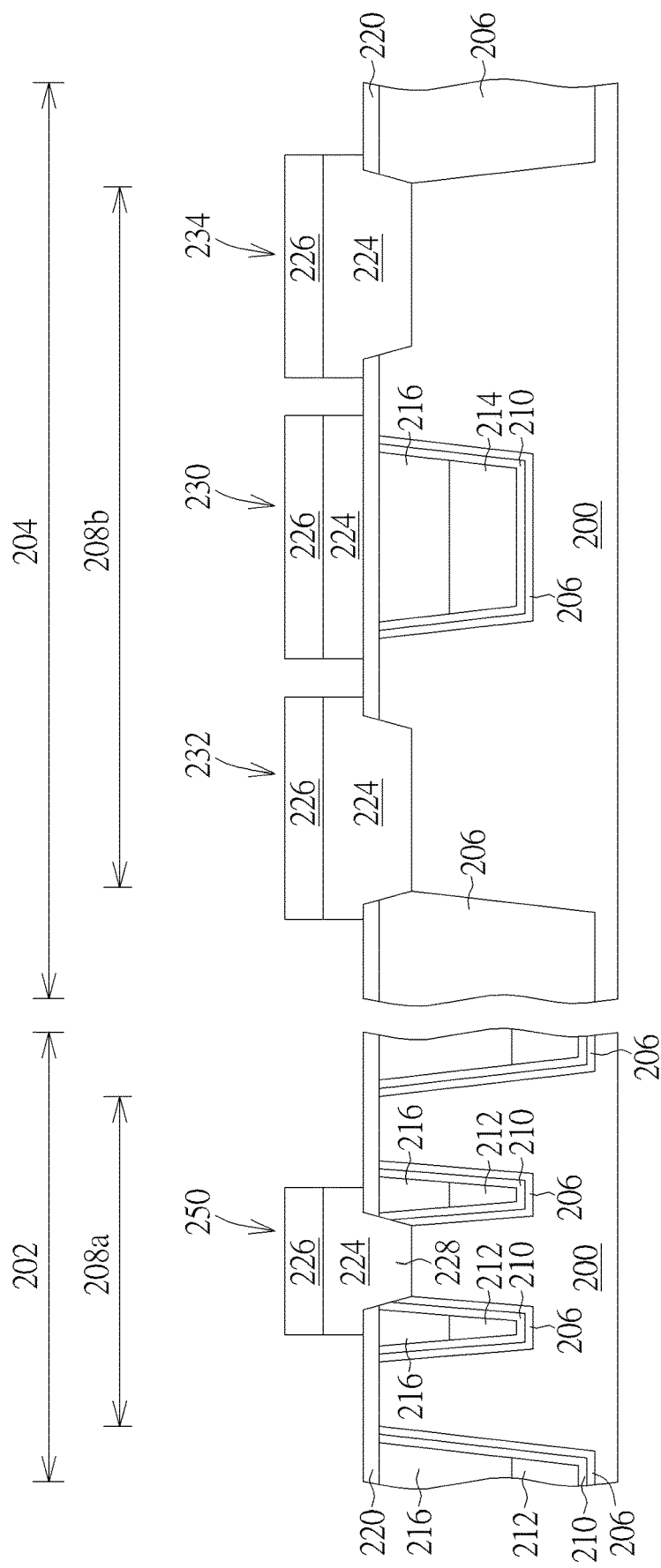

Please refer to FIG. 6. After forming the semiconductor layer 224 and the metal-containing layer 226, a patterning process is performed to form bit line contact plugs 228 and bit line structures 250 in the memory cell region 202. Simultaneously, a conductive line structure or a planar gate structure 230, a contact plug lower portion 232, and a contact plug lower portion 234 are formed in the peripheral circuit region 204. It is therefore concluded that the bit line contact plug 228/the bit line structure 250 in the memory cell region 202 and the contact plug lower portion 232, the contact plug lower portion 234 and the planar gate structure 230 in the peripheral circuit region 204 can include the same material. Furthermore, the patterning process can be simultaneously stopped at the insulating layer 220, but not limited to this. As shown in FIG. 6, the bit line contact plug 228 in the memory cell region 202 is physically and electrically connected to the source/drain region in between the two buried gates 212 in each active region 208a, and the bit line structure 250 is electrically connected to the memory cells 218 arranged in the same column by the bit line contact plugs 228. In the peripheral circuit region 204, the planar gate structure 230 is directly formed on the buried word line structure 214. Furthermore, the conductive line structure/the planar gate structure 230 overlaps the buried word line structure 214 and serves as a signal line structure. And the insulating layer 216/220 is sandwiched between the conductive line structure/the planar gate structure 230 and the buried word line structure 214, such that the planar gate structure 230 and the buried word line structure 214 are physically spaced apart and electrically isolated from each other by the insulating layer 216/220. The contact plug lower portion 232 is formed on the active region 208b at a first side of the buried word line structure 214, and the contact plug lower portion 234 is formed on the active region 208b at a second side of the buried word line structure 214 opposite to the first side, as shown in FIG. 6. Additionally, in some embodiments of the present invention, spacer liners can be formed on sidewalls of the planar gate structure 230, sidewalls of the bit line structures 250, and sidewalls of the contact plug lower portions 232 and 234, but not limited to this.

Figure 7:
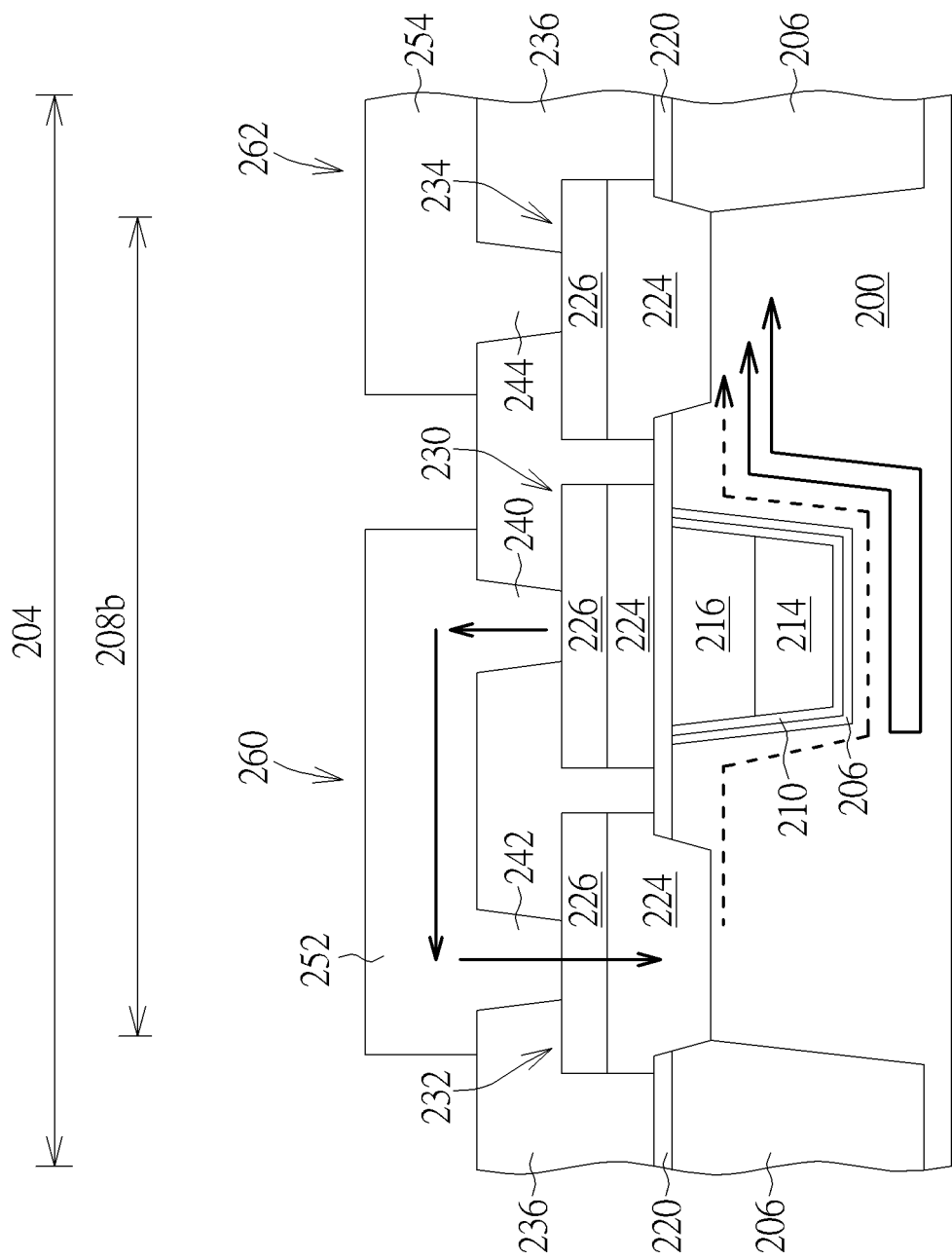

Please refer to FIG. 7. It should be noted that though only the elements in the peripheral circuit region 204 are depicted in FIG. 7, those skilled in the art should easily realize steps for forming elements in the memory cell region 202, therefore those details are omitted in the interest of brevity. Next, an interlayer dielectric (hereinafter abbreviated as ILD) layer 236 is formed on the substrate 200 and followed by forming a first contact plug 240, a contact plug upper portion 242 and a contact plug upper portion 244 in the ILD layer 236 in the peripheral circuit region 204. It is therefore concluded that the first contact plug 240, the contact plug upper portion 242, and the contact plug upper portion 244 in the peripheral circuit region 204 all include the same material. As shown in FIG. 7, in the peripheral circuit region 204, the first contact plug 240 is directly formed on the planar gate structure 230, and is physically and electrically connected to the planar gate structure 230. The contact plug upper portion 242 is physically and electrically connected to the contact plug lower portion 232, and thus a second contact plug 232/242 is constructed. The contact plug upper portion 244 is physically and electrically connected to the contact plug lower portion 234, and thus a third contact plug 234/244 is constructed.

Please still refer to FIG. 7. After forming the first contact plug 240, the second contact plug 232/242 and the third contact plug 234/244, a connecting layer 252 and a connecting layer 254 are formed in the peripheral circuit region 204. As shown in FIG. 7, the connecting layer 252 electrically connects the first contact plug 240 and the second contact plug 232/242, and the connecting layer 254 is electrically connected to the third contact plug 234/244. It is noteworthy that the first contact plug 240, the second contact plug 232/242, and the connecting layer 252 construct a local inter connection structure 260 at the first side of the buried word line structure 214, and the local inter connection structure 260 electrically connects the planar gate structure 230 and the active region 208b. The third contact plug 234/244 and the connecting layer 254 construct an interconnection structure 262 on the active region 208b at the second side of the buried word line structure 214. More important, the interconnection structure 262 electrically connects the active region 208b to a bit line BL, or alternatively electrically connects the active region 208b to a bit line bar /BL.

According to the method provided by the preferred embodiment, all elements in the peripheral circuit region 204 can be formed and integrated with the formation of the elements in the memory cell region 202. Furthermore, since the gates for the transistors required in the peripheral circuit region 204 are replaced with the buried word line structure 214, and the conductive line structure 230 is directly formed on the buried word line structure 214, area occupied by those elements are reduced.

Figure 8:
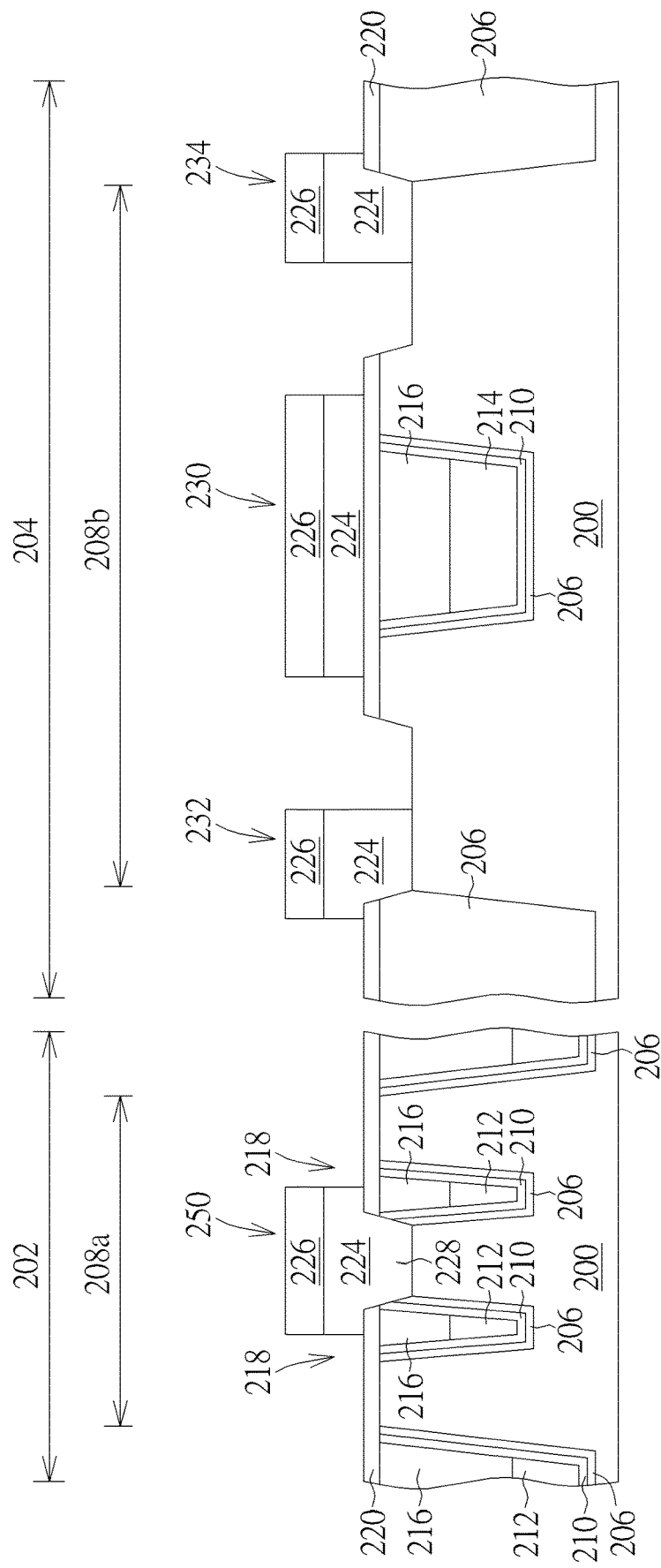
Figure 9:
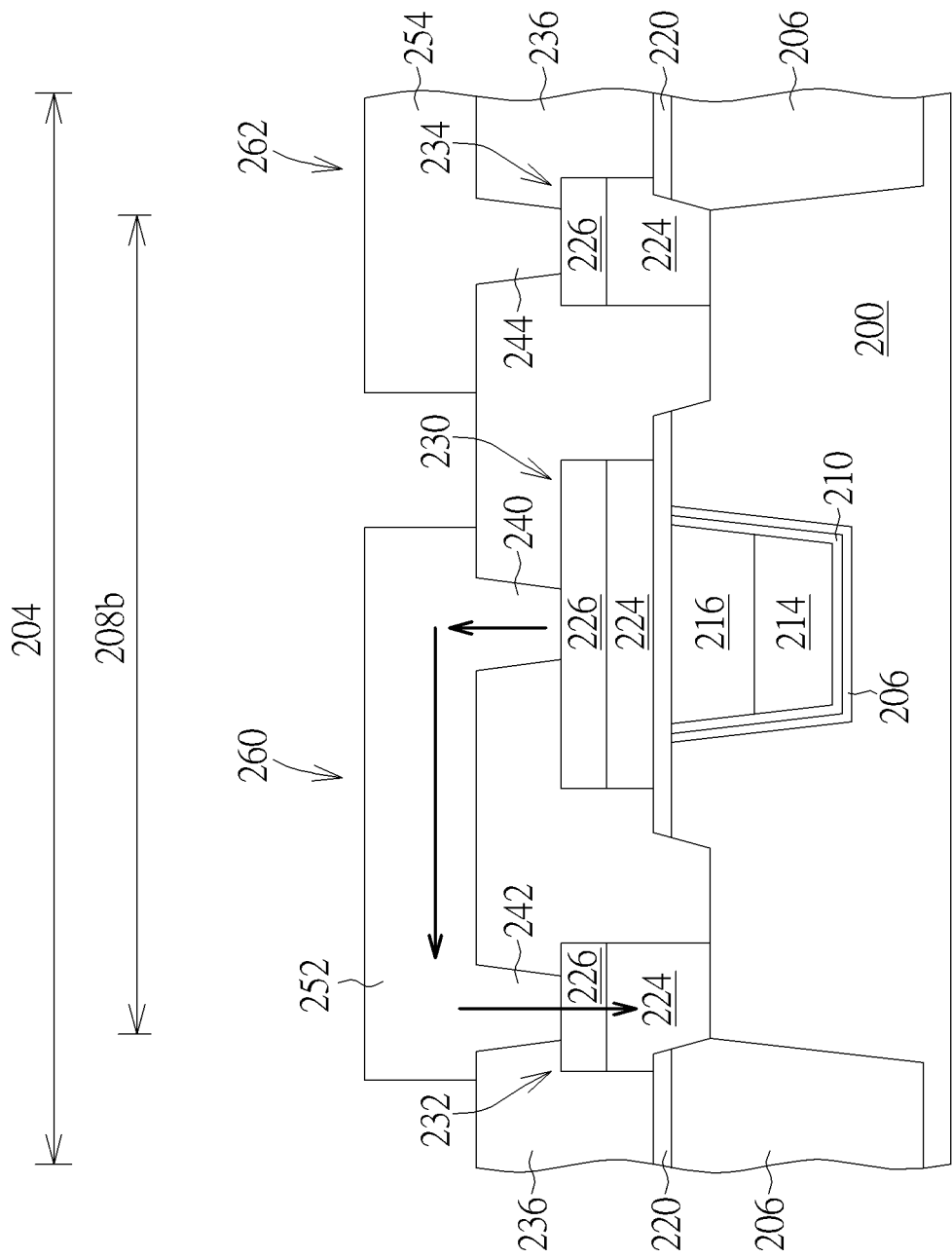

Please refer to FIG. 3 and FIGS. 8-9, which are schematic drawings illustrating a method for forming a semiconductor structure for a DRAM device provided by a second preferred embodiment of the present invention. It is noteworthy that elements the same in both of the first and second preferred embodiments include the same numerals and can include the same material, and thus details are omitted in the interest of brevity. As shown in FIG. 3, the method of the preferred embodiment provides a substrate 200 including at least a memory cell region 202 and a peripheral circuit region 204 defined thereon. A plurality of STI structures 206 are formed in the substrate 200 in the memory cell region 202 and the peripheral circuit region 204. The STI structures 206 are formed to define a plurality of active regions 208a in the memory cell region 202 and at least an active region 208b in the peripheral circuit region 204. Next, buried gates 212 are formed in the memory cell region 202. It is noteworthy that a buried gate structure serving 214 as a word line structure 214 is formed in the STI structure 206 in the peripheral circuit region 204 simultaneously with forming the buried gates 212. As shown in FIG. 8, top surfaces of the buried gates 212 and the buried word line structure 214 are all lower than a surface of the substrate 200. And an insulating layer 216 is formed on the buried gates 212 and the buried word line structure 214. Thereafter, source/drain regions (not shown) are formed in the substrate 200 at two sides of the buried gates 212 and the buried word line structure 214. Accordingly, a plurality of memory cells 218 are formed in the memory cell region 202, and the memory cells 218 are arranged in array-like manner, i.e. in row and column directions in the memory cell region 202.

Please refer to FIG. 8. A patterned process is then performed to remove portions of the insulating layer 220, and thus a portion of the active regions 208a in the memory cell region 202 and portions of the active region 208b in the peripheral circuit region 204 are exposed. In some embodiments of the present invention, steps can be performed directly after exposing the abovementioned portions of active regions 208a/208b. In other embodiments of the present invention, the exposed portions/substrate 200 can be etched and thus recesses are formed as shown in FIG. 8. Next, a semiconductor layer 224 is blanketly formed on the substrate 200 and a metal-containing layer 226 is subsequently formed on the semiconductor layer 224. A patterning process is then performed to form bit line contact plugs 228 and bit line structures 250 in the memory cell region 202. Simultaneously, a planar gate structure 230, a contact plug lower portion 232, and a contact plug lower portion 234 are formed in the peripheral circuit region 204. As shown in FIG. 8, the bit line contact plug 228 in the memory cell region 202 is physically and electrically connected to the source/drain region in between the two buried gates 212 in each active region 208a, and the bit line structure 250 is electrically connected to the memory cells 218 arranged in the same column by the bit line contact plugs 228. In the peripheral circuit region 204, the planar gate structure 230 is directly formed on the buried word line structure 214. Furthermore, the planar gate structure 230 overlaps the buried word line structure 214 and serves as a signal line structure. And the insulating layer 216/220 is sandwiched between the planar gate structure 230 and the buried word line structure 214, such that the planar gate structure 230 and the buried word line structure 214 are physically spaced apart and electrically isolated from each other by the insulating layer 216/220. The contact plug lower portion 232 is formed on the active region 208b at a first side of the buried word line structure 214, and the contact plug lower portion 234 is formed on the active region 208b at a second side of the buried word line structure 214 opposite to the first side, as shown in FIG. 8. It is noteworthy that in the preferred embodiment, the insulating layer serving as an etch stop layer is removed from the active region 208b at the two sides of the buried word line structure 214. Therefore, the etching process performed to remove portions of the semiconductor layer 224 and the metal-containing layer 226 can be controlled by other parameters such as process duration, but not limited to this.

Please refer to FIG. 9. As mentioned above, it should be noted that thought only the elements in the peripheral circuit region 204 are depicted in FIG. 9, those skilled in the art should easily realize steps for forming elements in the memory cell region 202, therefore those details are omitted in the interest of brevity. Next, an ILD layer 236 is formed on the substrate 200 and followed by forming a first contact plug 240, a contact plug upper portion 242 and a contact plug upper portion 244 in the ILD layer 236 in the peripheral circuit region 204. It is therefore concluded that the first contact plug 240, the contact plug upper portion 242, and the contact plug upper portion 244 in the peripheral circuit region 204 all include the same material. As shown in FIG. 9, in the peripheral circuit region 204, the first contact plug 240 is directly formed on the planar gate structure 230, and is physically and electrically connected to the planar gate structure 230. The contact plug upper portion 242 is physically and electrically connected to the contact plug lower portion 232, and thus a second contact plug 232/242 is constructed. The contact plug upper portion 244 is physically and electrically connected to the contact plug lower portion 234, and thus a third contact plug 234/244 is constructed.

Please still refer to FIG. 9. After forming the first contact plug 240, the second contact plug 232/242 and the third contact plug 234/244, a connecting layer 252 and a connecting layer 254 are formed in the peripheral circuit region 204. As shown in FIG. 9, the connecting layer 252 electrically connects the first contact plug 240 and the second contact plug 232/242, and the connecting layer 254 is electrically connected to the third contact plug 234/244. It is noteworthy that the first contact plug 240, the second contact plug 232/242, and the connecting layer 252 construct a local inter connection structure 260 on the active region 208b at the first side of the buried word line structure 214, and the local inter connection structure 260 electrically connects the planar gate structure 230 and the active region 208b. The third contact plug 234/244 and the connecting layer 254 construct an interconnection structure 262 on the active region 208b at the second side of the buried word line structure 214. And the interconnection structure 262 electrically connects the active region 208b to a bit line BL, or alternatively to a bit line bar /BL.

According to the method provided by the preferred embodiment, all elements in the peripheral circuit region 204 can be formed and integrated with the formation of the elements in the memory cell region 202. Furthermore, since the gates for the transistors required in the peripheral circuit region 204 are replaced with the buried word line structure 214, and the signal line structure 230 is directly formed on the buried word line structure 214, area occupied by those elements are reduced. Compared with the first preferred embodiment as shown in FIG. 6, since no insulating layer 220 is sandwiched between the semiconductor layer 224 and the substrate 202, resistance between the second contact plug 232/242 and the active region 208b and resistance between the third contact plug 234/244 and the active region 208b are reduced in accordance with the preferred embodiment.

Figure 10:
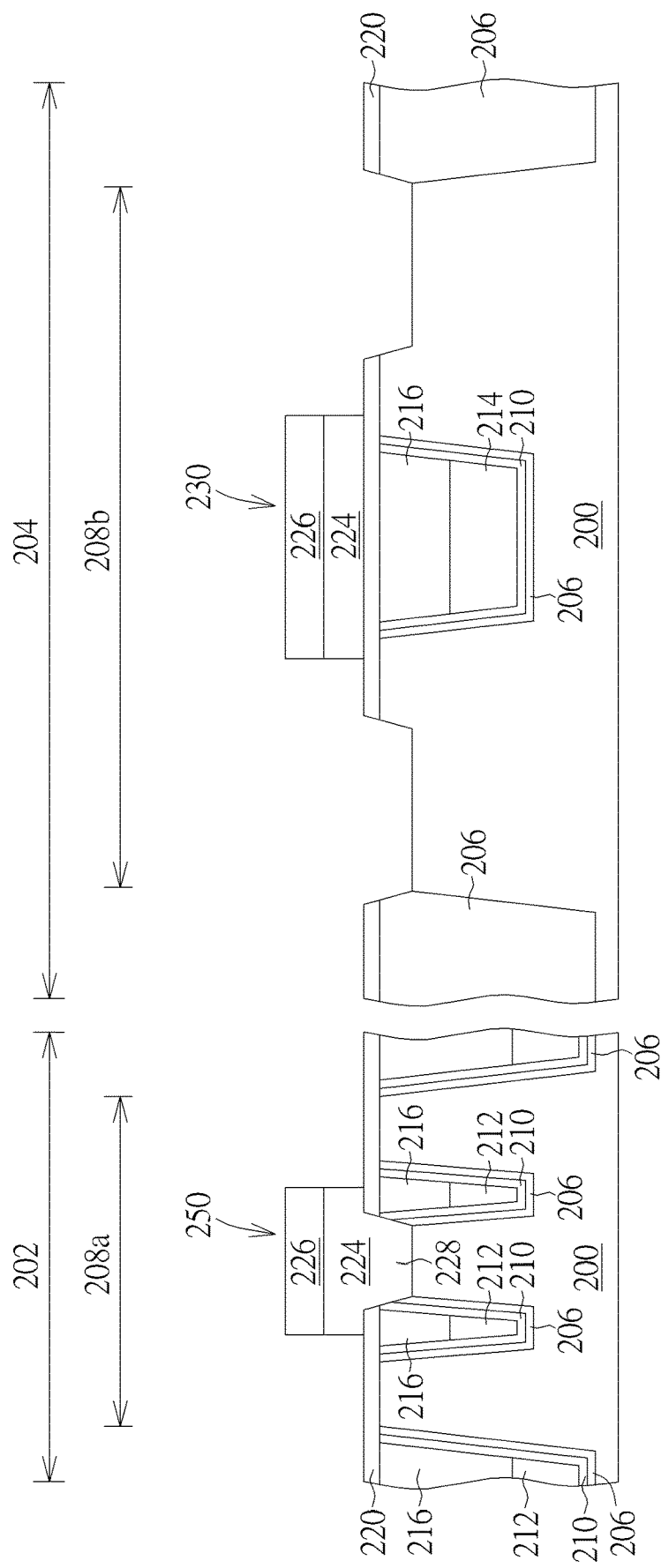
Figure 11:
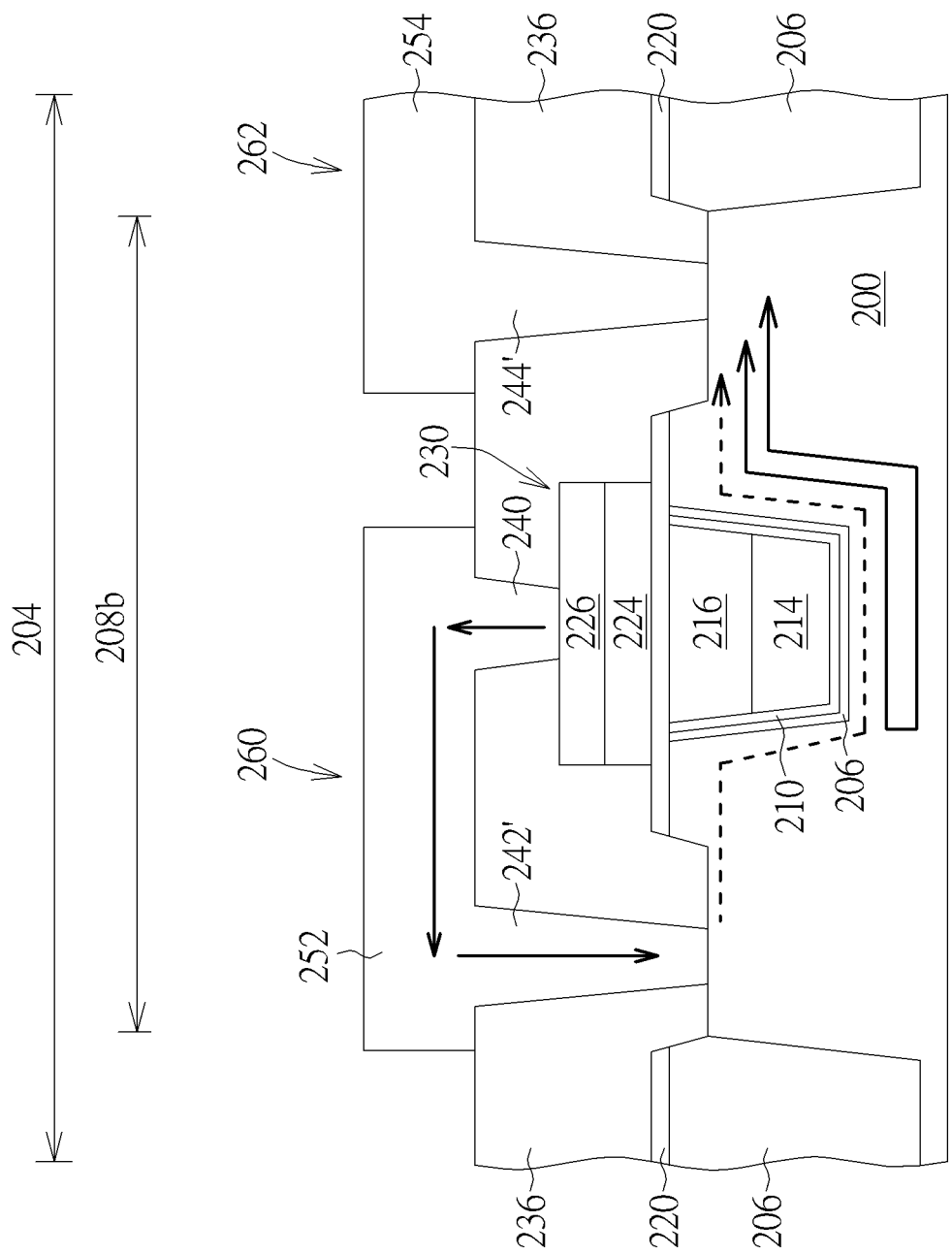

Please refer to FIGS. 3 and 10-11, which are schematic drawings illustrating a method for forming a semiconductor structure for a DRAM device provided by a third preferred embodiment of the present invention. It is noteworthy that elements the same in both of the first and third preferred embodiments include the same numerals and can include the same material, and thus details are omitted in the interest of brevity. As shown in FIG. 3, the method of the preferred embodiment provides a substrate 200 including at least a memory cell region 202 and a peripheral circuit region 204 defined thereon. A plurality of STI structures 206 are formed in the substrate 200 to define a plurality of active regions 208a in the memory cell region 202 and at least an active region 208b in the peripheral circuit region 204. Next, buried gates 212 are formed in the memory cell region 202, and a buried gate structure 214 serving as a buried word line structure 214 is simultaneously formed in the STI structure 206 in the peripheral circuit region 204. As shown in FIG. 3, top surfaces of the buried gates 212 and the buried word line structure 214 are all lower than a surface of the substrate 200. An insulating layer 216 is then formed on the buried gates 212 and the buried word line structure 214. Thereafter, source/drain regions (not shown) are formed in the substrate 200 at two sides of the buried gates 212 and the buried word line structure 214. Accordingly, a plurality of memory cells 218 are formed in the memory cell region 202. The memory cells 218 are arranged in array-like manner, i.e. in row and column directions in the memory cell region 202.

Please refer to FIG. 10. A patterned process is then performed to remove portions of the insulating layer 220, and thus a portion of the active regions 208a in the memory cell region 202 and portions of the active region 208b in the peripheral circuit region 204 are exposed. In some embodiments of the present invention, steps can be performed directly after exposing the abovementioned portions of active regions 208a/208b. In other embodiments of the present invention, the exposed portions/substrate 200 can be etched and thus recesses are formed as shown in FIG. 10. Next, a semiconductor layer 224 is blanketly formed on the substrate 200 and a metal-containing layer 226 is then formed on the semiconductor layer 224. A patterning process is subsequently performed to form bit line contact plugs 228 and bit line structures 250 in the memory cell region 202. Simultaneously, a planar gate structure 230 is formed in the peripheral circuit region 204. As shown in FIG. 10, the bit line contact plug 228 in the memory cell region 202 is physically and electrically connected to the source/drain region in between the two buried gates 212 in each active region 208a, and the bit line structure 250 is electrically connected to the memory cells 218 arranged in the same column by the bit line contact plugs 228. In the peripheral circuit region 204, the planar gate structure 230 is directly formed on the buried word line structure 214. Furthermore, the planar gate structure 230 overlaps the buried word line structure 214 and serves as a signal line structure. The insulating layer 216/220 is sandwiched between the planar gate structure 230 and the buried word line structure 214, such that the planar gate structure 230 and the buried word line structure 214 are physically spaced apart and electrically isolated from each other by the insulating layer 216/220. Additionally, the semiconductor layer 224 and the metal-containing layer 226 at two sides of the buried word line structure 214 are removed and thus the active region 208b is exposed. It is noteworthy that in the preferred embodiment, the insulating layer serving as an etch stop layer is removed from the active region 208b at the two sides of the buried word line structure 214. Therefore, the etching process performing to remove portions of the semiconductor layer 224 and the metal-containing layer 226 can be controlled by other parameters such as process duration, but not limited to this.

Please refer to FIG. 11. As mentioned above, it should be noted that though only the elements in the peripheral circuit region 204 are depicted in FIG. 11, those skilled in the art should easily realize steps for forming elements in the memory cell region 202, therefore those details are omitted in the interest of brevity. Next, an ILD layer 236 is formed on the substrate 200 and followed by forming a first contact plug 240, a second contact plug 242' and a third contact plug 244' in the ILD layer 236 in the peripheral circuit region 204. In other words, the first contact plug 240, the second contact plug 242' and the third contact plug 244' in the peripheral circuit region 204 include the same material. As show in FIG. 11, in the peripheral circuit region 204, the first contact plug 240 is directly formed on the planar gate structure 230, and is physically and electrically connected to the planar gate structure 230. The second contact plug 242' is physically and electrically connected to the active region 208b at a first side of the buried word line structure 214. And the third contact plug 244' is physically and electrically connected to the active region 208b at a second side of the buried word line structure 214 opposite to the first side.

Please still refer to FIG. 11. After forming the first contact plug 240, the second contact plug 242' and the third contact plug 244', a connecting layer 252 and a connecting layer 254 are formed in the peripheral circuit region 204. As shown in FIG. 11, the connecting layer 252 electrically connects the first contact plug 240 and the second contact plug 242', and the connecting layer 254 is electrically connected to the third contact plug 244'. As mentioned above, the first contact plug 240, the second contact plug 242', and the connecting layer 252 construct a local inter connection structure 260 on the active region 208b at the first side of the buried word line structure 214, and the local inter connection structure 260 electrically connects the planar gate structure 230 and the active region 208b. The third contact plug 244' and the connecting layer 254 construct an interconnection structure 262 on the active region 208b at the second side of the buried word line structure 214. And the interconnection structure 262 electrically connects the active region 208b to a bit line BL, or alternatively to a bit line bar /BL.

According to the method provided by the preferred embodiment, all elements in the peripheral circuit region 204 can be formed and integrated with the formation of the elements in the memory cell region 202. Furthermore, since the gates for the transistors required in the peripheral circuit region 204 are replaced with the buried word line structure 214, and the signal line structure 230 is directly formed on the buried word line structure 214, area occupied by those elements are reduced.

Figure 12:
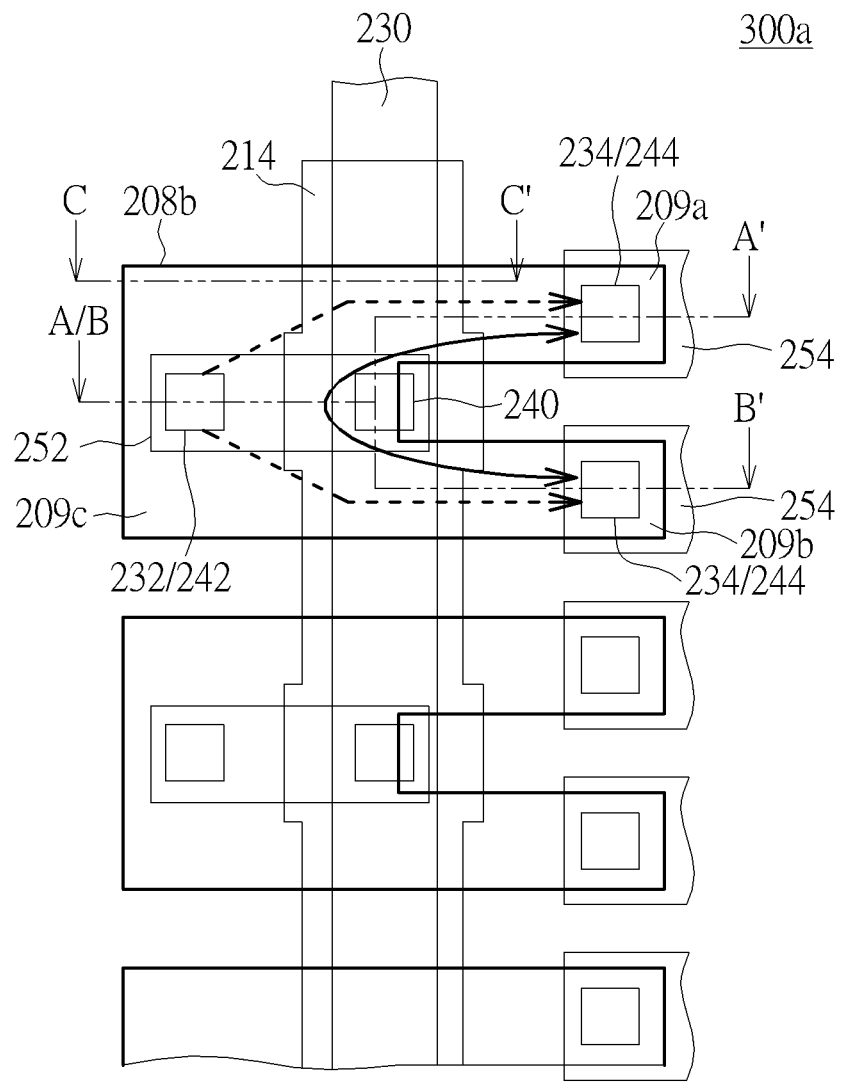
FIGS. 12-17 are schematic drawings respectively illustrating a semiconductor structure provided by preferred embodiments of the present invention.
Figure 17:
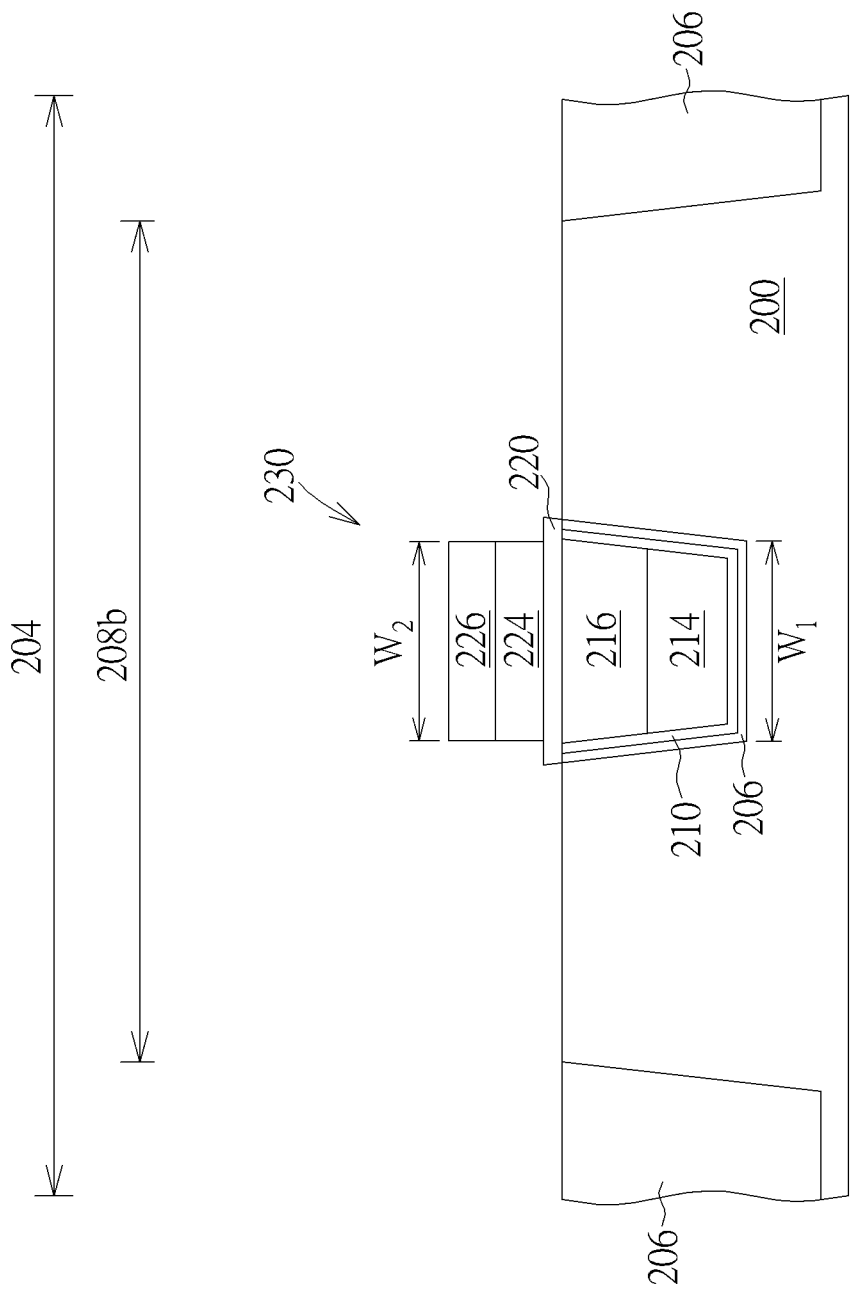

Please refer to FIGS. 12 and 17, which are schematic drawings illustrating a semiconductor structure provided by a preferred embodiment of the present invention. It should be noted that the semiconductor structure provided by the preferred embodiment shown in FIGS. 12 and 17 can be formed by performing the method provided by the abovementioned preferred embodiments. FIGS. 7, 9 and 11 can be a cross-sectional view taken along a line A-A' or B-B' of FIG. 12, respectively, and FIG. 17 can be a cross-sectional view taken along a line C-C' of FIG. 12. As shown in FIG. 12, the layout structure of the semiconductor structure 300a provided by the preferred embodiment includes a plurality of active regions 208b defined by the STI structure (not shown) in the peripheral circuit region 204 of a DRAM device. In some embodiments of present invention, the active regions 208b respectively can include a comb shape. The comb shape includes tooth portions, and the tooth portions are extended along a first direction D1. In the preferred embodiment, the active regions 208b respectively include a first tooth portion 209a, a second tooth portion 209b, and a base portion 209c, as shown in FIG. 12. The layout structure of the semiconductor structure 300a further includes a buried word line structure 214 and a conductive line structure/planar gate structure 230 extended along a second direction D2. The second direction D2 and the first direction D1 are perpendicular to each other. More important, the conductive line structure/the planar gate structure 230 overlaps the buried word line structure 214, but the conductive line structure/the planar gate structure 230 is physically spaced apart and electrically isolated from the buried word line structure 214 by the insulating layer 216/220, as shown in FIGS. 7, 9, 11 and 17. The second contact plug 232/242 (or 242') is formed on the active region 208b at the first side of the buried word line structure 214. That is, the second contact plug 232/242 (or 242') is formed on the base portion 209c. And the third contact plug 234/244 (or 244') is formed on the active region 208b at the second side of the buried word line structure 214. More important, the second contact plug 232/242 (or 242') is formed on both of the first tooth portion 209a and the second tooth portion 209b. It is noteworthy that the third contact plug 234/244 (or 244') formed on the first tooth portion 209a and the connecting layer 254 construct the interconnection structure 262 (shown in FIGS. 7, 9, and 11) in accordance with the preferred embodiment, and the interconnection structure 262 is electrically connected to the bit line BL. And the third contact plug 234/244 (or 244') formed on the second tooth portion 209b and the connecting layer 254 construct the interconnection structure 262 (shown in FIGS. 7, 9, and 11), and the interconnection structure 262 is electrically connected to the bit line bar /BL. The first contact plug 240 is formed on the conductive line structure/the planar gate structure 230 and electrically connected to the second contact plug 232/242 (or 242') by the connecting layer 252, and thus the local inter connection structure 260 is constructed by the first contact plug 240, the second contact plug 232/242 (or 242') and the connecting layer 252 (shown in FIGS. 7, 9, and 11). Additionally, the buried word line structure 214 includes a first width W1, the conductive line structure/the planar gate structure 230 includes a second width W2 as shown in FIGS. 7, 9, 11, 12, and 17. It is noteworthy that the second width W2 of the conductive line structure/the planar gate structure 230 is larger than the first width W1 at where the first contact plug 240 is to be formed, thus process window for the first contact plug 240 is improved. On the other hand, the second width W2 of the conductive line structure/the planar gate structure 230 is smaller than first width W1 at where no first contact plug 240 is required.

According to the semiconductor structure provided by the preferred embodiment, the signal line structure/the planar gate structure 230 receives a pre-charge voltage VBLP, and currents therefore flow into the base portion 209c of the active region 208b through the first contact plug 240, the connecting layer 252 and the second contact plug 232/242 (or 242'). Furthermore, the currents pass a channel region formed around the buried word line structure 214 and subsequently the first tooth portion 209a of the active region 208b, and then to the bit line BL through the interconnection structure 262 (that includes the third contact plug 234/244 (or 244') and the connecting layer 254) as depicted by the dotted line shown in FIG. 12. On other hand, the currents pass a channel region formed around the buried word line structure 214 and subsequently the second tooth portion 209b of the active region 208b, and then to the bit line bar/BL through the interconnection structure 262 (that includes the third contact plug 234/244 (or 244') and the connecting layer 254). Consequently, the two pre-charge transistors are obtained in accordance with the preferred embodiment. Furthermore, the first tooth portion 209a, the buried word line structure 214, and the second tooth portion 209b construct a BL equalizer transistor with the first tooth portion 209a (electrically connected to bit line BL) and the second tooth portion 209b ((electrically connected to bit line bar/BL) respectively serving as a source and a drain of the BL equalizer transistor, as depicted by the bold line shown in FIG. 12.

Accordingly, the semiconductor structure provided by the preferred embodiment includes a pre-charge unit of a BL sensing amplifier in the DRAM device. And the buried word line structure 214 serves as the gates for the three transistors required by the pre-charge unit. Since the signal line structure or the planar gate structure that provides the pre-charge voltage VBLP is directly formed on the buried word line structure, area required by the pre-charge unit is reduced. Furthermore, landing pads which occupy large areas but are always required in the prior art can be taken out according to the present invention, and thus product yield is improved.

Please refer to FIGS. 13-16, which are schematic drawings respectively illustrating a semiconductor structure provided by preferred embodiments of the present invention. It is noteworthy that elements the same in the aforementioned embodiments and the instant embodiment can include the same numerals and can include the same material, and thus details are omitted in the interest of brevity. And steps for forming those elements are also omitted for brevity.

Figure 13:
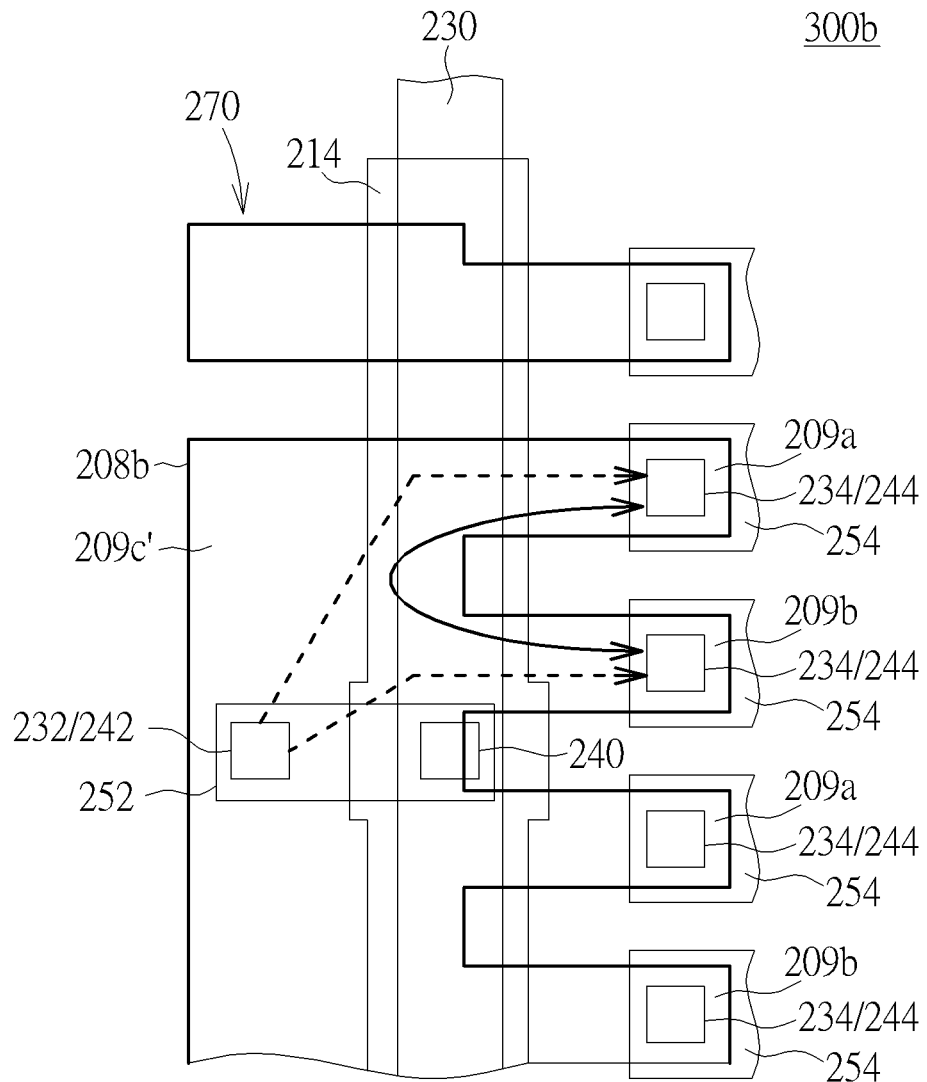

Please refer to FIG. 13. The difference between the embodiment depicted in FIG. 13 and that depicted in FIG. 12 is: two base portions of the two adjacent active regions 208b can be physically connected to each other according to the semiconductor structure 300b provided by the preferred embodiment. And thus a continuous common base portion 209c' is obtained. Furthermore, one first contact plug 240 can be formed on the signal line structure/the planar gate structure 230, and one second contact plug 232/242 (or 242') can be formed on the common base portion 209c' in the preferred embodiment. Thus, layout and routing design for the pre-charge unit of the BL sensing amplifier can be simplified. However, in some modifications to the preferred embodiment, two second contact plugs can be formed on the common base portion 209c' and two first contact plugs can formed on the signal line structure/the planar gate structure 230 if required. Additionally, dummy structures (not shown) can be formed if required.

Figure 14:
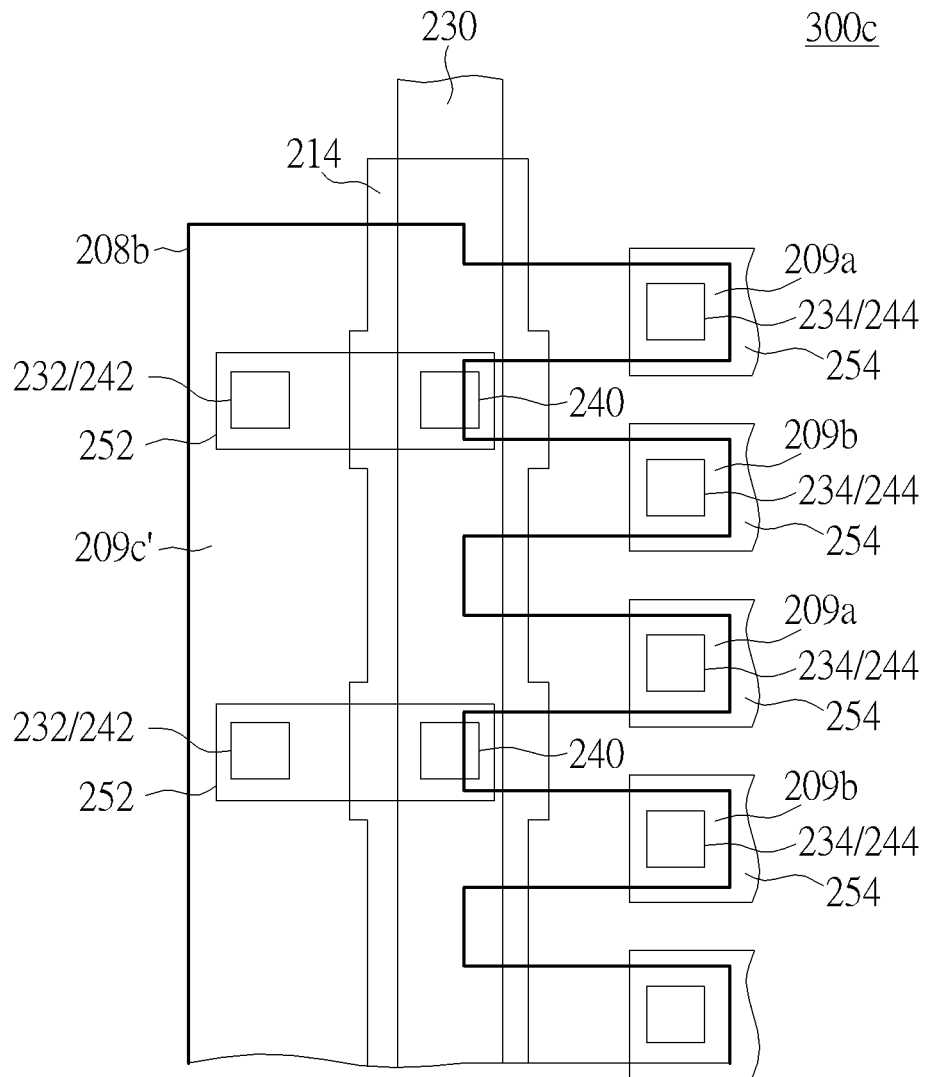

Please refer to FIG. 14. The difference between the embodiment depicted in FIG. 14 and that depicted in FIG. 12 is: all of base portions of the active regions 208b are physically connected to each other according to the semiconductor structure 300c provided by the preferred embodiment. And thus a continuous common base portion 209c' is obtained. Thus layout and routing design for the pre-charge unit of the BL sensing amplifier can be further simplified. Furthermore, a plurality of second contact plugs 232/242 (or 242') can be formed on the common base portion 209c' and a plurality of first contact plugs 240 can be formed on the signal line structure/the planar gate structure 230. In some embodiments of the present invention, the amount of the second contact plugs 232/242 (or 242') and the amount of the first contact plugs 240 can be equal to a pair number of the first tooth portion 209a and the second tooth portion 209b. However, in other embodiments of the present invention, only one first contact plug is formed on the signal line structure/the planar gate structure 230 and only one second contact plug is formed on the common base portion 209c' if required. Additionally, dummy structures (not shown) can be formed if required.

Figure 15:
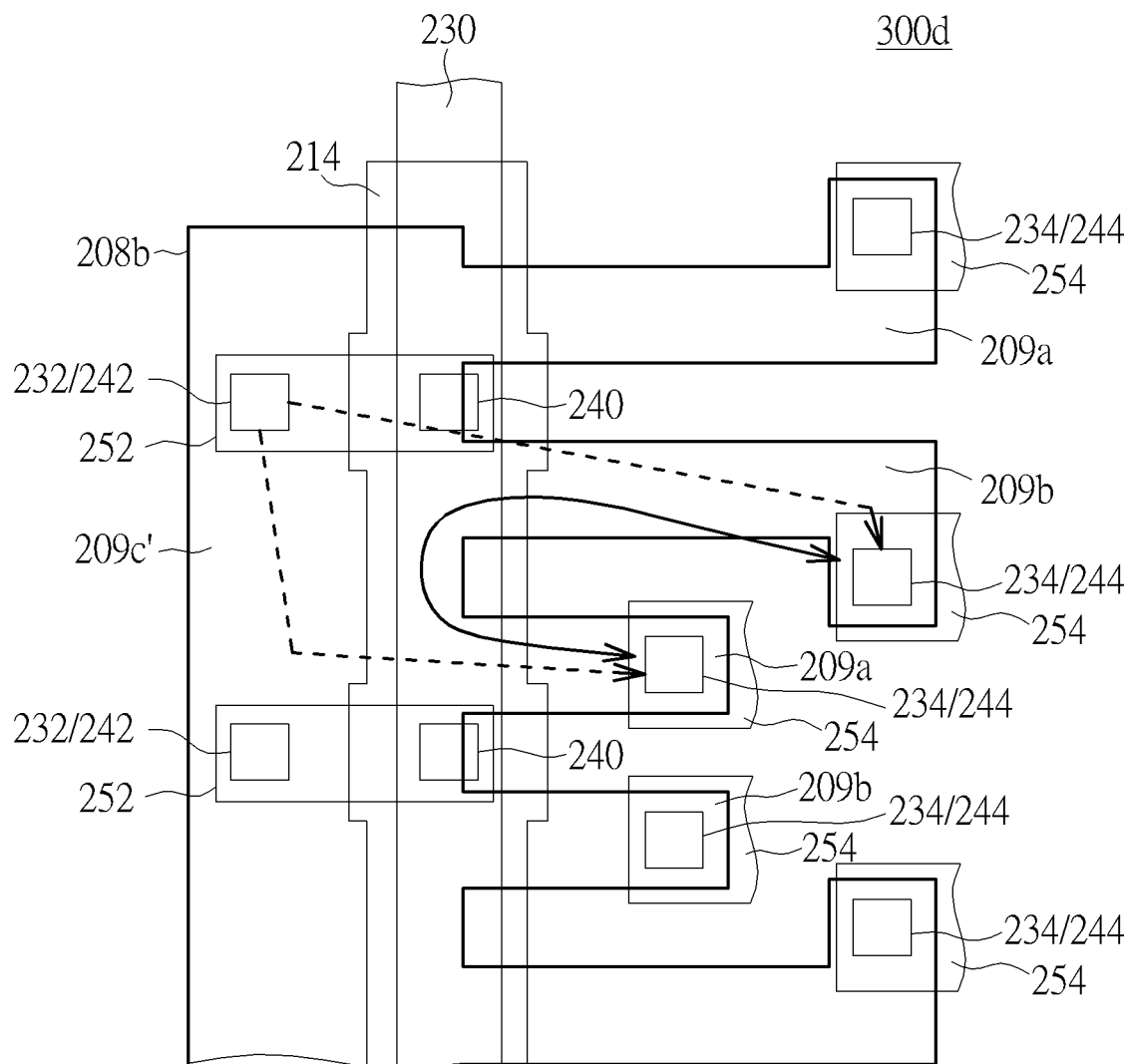

Please refer to FIG. 15. The difference between the embodiment depicted in FIG. 15 and that depicted in FIG. 12 is: the first tooth portion 209a and the second tooth portion 209b of the semiconductor structure 300d are formed pair by pair. Thus different pairs of first tooth portion 209a and second tooth portion 209b can include different lengths. By forming pairs of first tooth portion 209a and second tooth portion 209b with different lengths, the third contact plugs 234/244 (or 244') can be formed in a stagger-like manner two-by-two, and thus process window for the third contact plugs 234/244 (or 244') is improved. Furthermore, in some embodiments of the present invention, the base portions 209c of the adjacent the active regions 208b can be formed individually as shown in FIG. 12. And in other embodiments of the present invention, the base portions can be physically connected to form a continuous common base portion 209c' as shown in FIG. 15. Additionally, dummy structures (not shown) can be formed if required.

Figure 16:
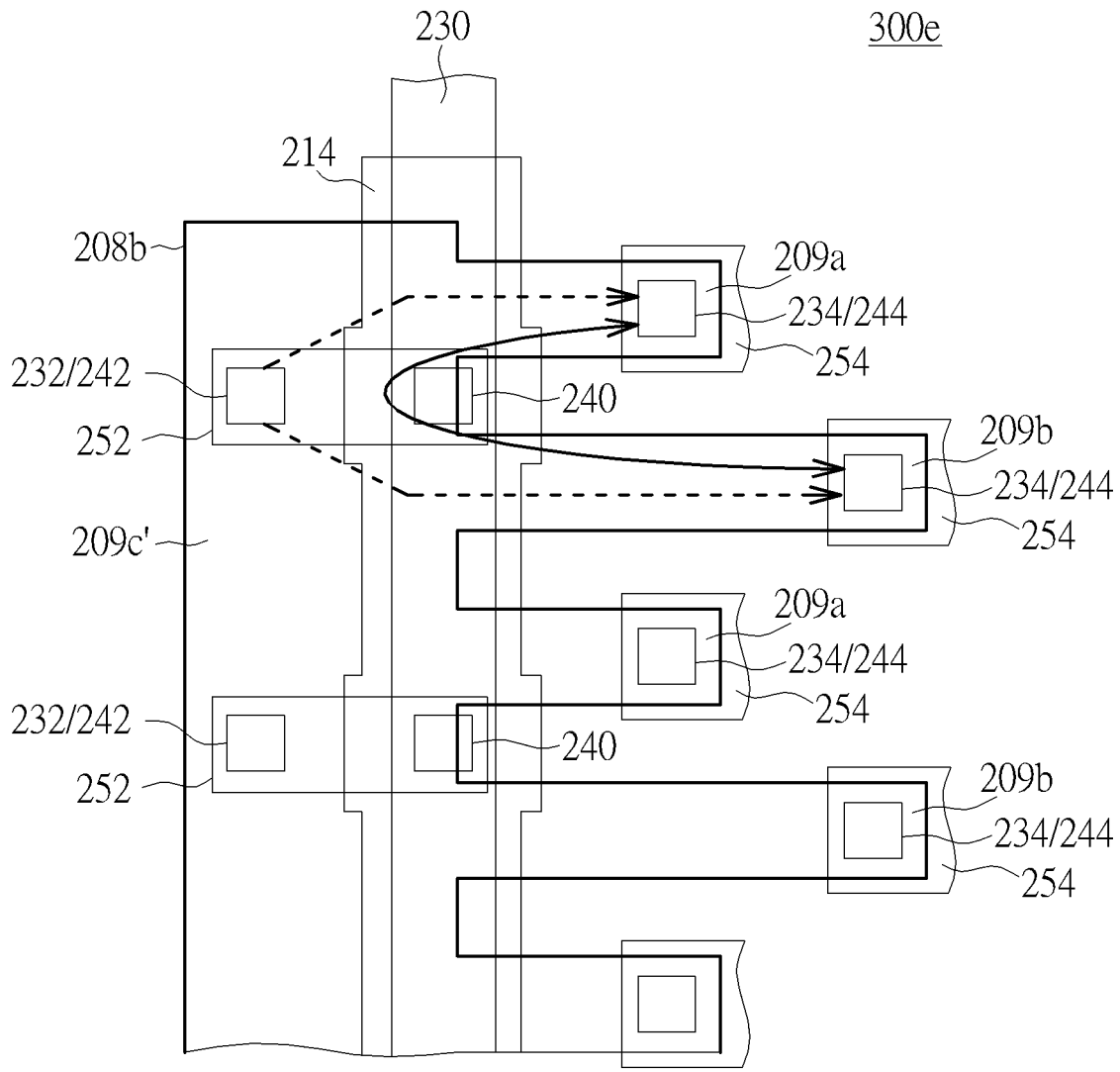

Please refer to FIG. 16. The difference between the embodiment depicted in FIG. 16 and that depicted in FIG. 12 is: the first tooth portion 209a and the second tooth portion 209b of the semiconductor structure 300e include different lengths. By forming the first tooth portion 209a and the second tooth portion 209b with different lengths, the third contact plugs 234/244 (or 244') can be formed in a stagger-like manner one-by-one, and thus process window for the third contact plugs 234/244 (or 244') is improved. Furthermore, in some embodiments of the present invention, the base portions 209c of the adjacent the active regions 208b can be formed individually as shown in FIG. 12. And in other embodiments of the present invention, the base portions can be physically connected to form a continuous common base portion 209c' as shown in FIG. 16. Additionally, dummy structures (not shown) can be formed if required.

According to the semiconductor structure, the semiconductor structure for the memory device, and the method for forming the same provided by the present invention, the buried word line structure is formed in the peripheral circuit region. More important, the buried word line structure concurrently serves as the gates for the three transistors of the pre-charge unit of the BL sensing amplifier. And the signal line structure or the planar gate structure that provides the pre-charge voltage VBLP is directly formed on the buried word line structure. Consequently, area required by the pre-charge unit is reduced. Furthermore, landing pads which occupy large areas but are always required in the prior art can be taken out according to the present invention, and thus product yield is improved. Additionally, the present invention provides layout structures that comply with different requirements, and layout and routing design for the pre-charge unit of the BL sensing amplifier can be further simplified.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A layout structure of semiconductor structure, comprising:
   a plurality of active regions defined by shallow trench isolations in a peripheral circuit region of a DRAM device;
   a planar gate structure formed on said active regions and extending along a first direction;
   a buried word line structure formed in said shallow trench isolations in the peripheral circuit region and extending along said first direction, wherein said planar gate structure overlaps said buried word line structure and is electrically isolated from said buried word line structure by an insulating layer;
   a first contact plug formed on said planar gate structure in the peripheral circuit region; and
   a second contact plug formed on said active region at a first side of said buried word line in the peripheral circuit region and electrically connected to said first contact plug by a connecting layer, wherein said first contact plug, said second contact plug and said connecting layer constitute a local interconnection structure.

2. The layout structure of semiconductor structure of claim 1, wherein a width of said planar gate structure is larger than a width of said buried word line structure.

3. The layout structure of semiconductor structure of claim 1, further comprises at least one third contact plug formed on said active region at a second side of said buried word line.

4. The layout structure of semiconductor structure of claim 3, wherein said active region at said first side of said buried word line comprises a base portion and said active region at said second side of said buried word line comprises a first tooth portion and a second tooth portion extending along a second direction, and said third contact plugs are formed respectively on said first tooth portion and said second tooth portion.

5. The layout structure of semiconductor structure of claim 4, wherein said third contact plug on said first tooth portion and said connecting layer constitute a first interconnection structure electrically connected to a bit line.

6. The layout structure of semiconductor structure of claim 4, wherein said third contact plug on said second tooth portion and said connecting layer constitute a second interconnection structure electrically connected to a bit line bar.

7. The layout structure of semiconductor structure of claim 4, wherein said first direction is perpendicular to said second direction.

8. The layout structure of semiconductor structure of claim 4, wherein said base portions of adjacent said active regions are physically connected to each other to form a common base portion.

9. The layout structure of semiconductor structure of claim 4, wherein a length of said first tooth portion and a length of said second tooth portion in each of comb-shaped active regions said are different.

10. The layout structure of semiconductor structure of claim 4, wherein said first tooth portion and said second tooth portion are in pair and have same length in one said active regions, and adjacent said pairs of said first tooth portion and said second tooth portion have different lengths.

* * * * *